(12) United States Patent
Herrmann et al.

(10) Patent No.: US 9,425,321 B2
(45) Date of Patent: Aug. 23, 2016

(54) THIN-FILM TRANSISTOR AND PROCESS FOR MANUFACTURE OF THE THIN-FILM TRANSISTOR

(71) Applicant: UNIVERSITAET STUTTGART, Stuttgart (DE)

(72) Inventors: Marcus Herrmann, Neuffen (DE); Norbert Fruehauf, Sindelfingen-Darmsheim (DE)

(73) Assignee: UNIVERSITAET STUTTGART, Stuttgart (DE)

( * ) Notice: Subject to any disclaimer, the term of this patent is extended or adjusted under 35 U.S.C. 154(b) by 0 days.

(21) Appl. No.: 14/515,579

(22) Filed: Oct. 16, 2014

(65) Prior Publication Data

US 2015/0108469 A1 Apr. 23, 2015

(30) Foreign Application Priority Data

Oct. 18, 2013 (DE) .......................... 10 2013 111 501

(51) Int. Cl.

| | |
|---|---|
| *H01L 21/321* | (2006.01) |
| *H01L 29/786* | (2006.01) |
| *H01L 21/465* | (2006.01) |
| *H01L 21/467* | (2006.01) |
| *H01L 27/12* | (2006.01) |
| *H01L 29/45* | (2006.01) |
| *H01L 29/66* | (2006.01) |

(52) U.S. Cl.
CPC ........ *H01L 29/78606* (2013.01); *H01L 21/321* (2013.01); *H01L 21/465* (2013.01); *H01L 21/467* (2013.01); *H01L 27/1225* (2013.01); *H01L 29/45* (2013.01); *H01L 29/66969* (2013.01); *H01L 29/7869* (2013.01); *H01L 29/78618* (2013.01)

(58) Field of Classification Search
CPC .................. H01L 2924/0002; H01L 2924/00; H01L 29/7869; H01L 27/1225; H01L 21/02565; H01L 21/02631; H01L 21/76843; H01L 2924/181; H01L 29/66969; H01L 29/45; H01L 21/02554; H01L 21/30604; H01L 21/7687
See application file for complete search history.

(56) References Cited

U.S. PATENT DOCUMENTS

| | | | |
|---|---|---|---|
| 6,406,928 B1 | 6/2002 | Jen et al. | |
| 8,063,421 B2 | 11/2011 | Kang et al. | |
| 8,563,976 B2 | 10/2013 | Yamazaki et al. | |
| 8,624,237 B2 | 1/2014 | Yamazaki et al. | |
| 8,728,862 B2 | 5/2014 | Ha et al. | |
| 8,803,142 B2 | 8/2014 | Yamazaki | |
| 8,835,909 B2 | 9/2014 | Han et al. | |
| 9,019,440 B2 | 4/2015 | Kuwabara | |
| 9,142,683 B2 | 9/2015 | Yamazaki et al. | |
| 2009/0236596 A1* | 9/2009 | Itai .................... | H01L 29/78618 257/43 |
| 2010/0025679 A1* | 2/2010 | Yamazaki .......... | H01L 29/7869 257/43 |

(Continued)

FOREIGN PATENT DOCUMENTS

| | | |
|---|---|---|
| EP | 2105967 | 9/2009 |
| JP | 2007165861 | 6/2007 |

(Continued)

*Primary Examiner* — Robert Bachner
(74) *Attorney, Agent, or Firm* — Michael J. Striker

(57) ABSTRACT

A thin-film transistor includes an oxidic semiconductor channel, a metallic or oxidic gate, drain and source contacts and at least one barrier layer positioned between the oxidic semiconductor channel and the drain and source contacts to inhibit an exchange of oxygen between the oxidic semiconductor channel and the drain and source contacts.

8 Claims, 5 Drawing Sheets

(56) References Cited

U.S. PATENT DOCUMENTS

| | | |
|---|---|---|
| 2011/0095274 A1* | 4/2011 | Chung ............... H01L 27/1225 257/40 |
| 2011/0299005 A1 | 12/2011 | Takeguchi et al. |
| 2012/0033152 A1 | 2/2012 | Ha et al. |
| 2012/0273780 A1 | 11/2012 | Yamazaki et al. |
| 2013/0001572 A1 | 1/2013 | Satoh et al. |
| 2013/0264564 A1 | 10/2013 | Park et al. |
| 2014/0117348 A1 | 5/2014 | Chiang et al. |
| 2015/0236129 A1 | 8/2015 | Kuwabara |

FOREIGN PATENT DOCUMENTS

| | | |
|---|---|---|
| JP | 2009231613 | 10/2009 |
| JP | 2011142316 | 7/2011 |
| JP | 2012109546 | 6/2012 |
| KR | 20080079906 | 9/2008 |
| KR | 20100005900 | 1/2010 |
| KR | 20130045270 | 5/2013 |
| TW | 201017883 | 5/2010 |
| TW | 201234437 | 8/2012 |
| TW | 201244114 | 11/2012 |

* cited by examiner

THIN-FILM TRANSISTOR AND PROCESS FOR MANUFACTURE OF THE THIN-FILM TRANSISTOR

CROSS-REFERENCE TO A RELATED APPLICATION

The invention described and claimed hereinbelow is also described in German Patent Application DE 10 2013 111 501.2, filed on Oct. 18, 2013. The German Patent Application, the subject matters of which is incorporated herein by reference, provides the basis for a claim of priority of invention under 35 U.S.C. 119(a)-(d).

BACKGROUND OF THE INVENTION

The present invention relates to a thin-film transistor, especially for active matrix displays, with an oxidic semiconductor channel and metallic or oxidic gate, drain and source contacts.

For the manufacture of silicon-based, thin-film transistors, a so-called back channel etch process is frequently carried out for which, in mass production, plasma etching processes are preferably used. One such process is described, for example, in U.S. Pat. No. 6,406,928 B1. In the process disclosed therein, a highly doped silicon film is placed between the metallic contact materials and the actual silicon semiconductor to avoid a Schottky effect, and etching is carried out directly onto the silicon semiconductor.

Because of the possibility of saving on masks, as opposed to the usual etch stopper processes, there also is a requirement to use back channel etch processes in the manufacture of thin-film transistors with an oxidic semiconductor channel, for example, those made from a zinc oxide compound. Such thin-film transistors are distinguished from transistors with a channel made from amorphous silicon by higher charge carrier mobility and lower power consumption.

Etch stopper processes, as well as plasma or wet chemical processes, carried out with the back channel etching procedure in the preparation of thin-film transistors with oxidic semiconductor channels, have fundamental problems through the coming together of metallic contacts, or even oxygen-affine conductive contacts, and the oxide semiconductors. An oxygen exchange takes place between the contacts and the oxide semiconductor which, depending on the material selection, leads to a steadily increasing thickness of an oxidic boundary layer. The formation of this boundary layer thereby increases not only the contact resistance, but also changes the oxide semiconductor properties such as threshold voltage, charge carrier mobility, etc. in an uncontrolled way through oxygen removal from the oxide semiconductor structure.

The electrical properties of the transistors are to a great extent dependent on oxygen imperfections in the oxide semiconductor material. Thus even the long term stability of the thin-film transistor is not assured, as the formation, or continued growth, of this oxidic boundary layer is strongly dependent on the load on the thin-film transistor (current flow, temperature, etc.).

SUMMARY OF THE INVENTION

The present invention overcomes the shortcomings of known arts, such as those mentioned above.

To that end, the present invention provides a thin-film transistor with an oxidic semiconductor channel, and a process for its manufacture, in which an oxygen exchange between the semiconductor material and the contact material is inhibited.

In an embodiment, the invention provides a thin-film transistor particularly suited for active matrix displays, with an oxidic semiconductor channel and metallic or oxidic gate, drain and source contacts. At least one barrier layer is positioned between the oxidic semiconductor channel and the drain and source contacts. The at least one barrier layer inhibits an exchange of oxygen between the oxidic semiconductor channel and the other layers, particularly the drain and source contacts.

In the thin-film transistor fabricated according to the invention, the at least one barrier layer inhibits an oxygen exchange between the contact material and the oxidic semiconductor channel, even at higher energy input, i.e. at higher currents and/or at increased temperature. The extent of the inhibition of an oxygen exchange between the oxide semiconductor and the contact material here depends on the material of the at least one barrier layer and its thickness, as well as its separation method in the manufacturing process and its positioning in the layer stack.

In order to avoid or inhibit an oxygen exchange the barriers should be inserted in the stack so that the contact material has no direct interface with the oxide semiconductor, but is set apart from it at an effective distance.

Besides, for example, electrically insulating or even conducting layers, the at least one barrier layer also can be formed of an insulating/semiconducting/conducting metal oxide layer. Where, for example, metallic contact materials are used, this latter layer can consist of an oxide of that material. Further parasitic oxidation of the metallic contact material could thus be inhibited (the reaction abates as a function of layer thickness) or, according to the selection of material, even be halted.

A direct separation and structuring of these metal oxide barriers is at the same time as equally conceivable, such as the controlled and accelerated premature ageing of the contact material by targeted parasitic oxidation of that material, with underlying layers. The targeted parasitic oxidation may be implemented, for example, by heating in an oxygen environment, in which it must be ensured that the properties of the oxidic semiconductor channel are not modified. A threshold temperature is defined, above which more oxygen is added to the oxygen containing atmosphere in the oxide semiconductor structure during the heating stage than is being conducted away from this via the contacts.

Increased short and long term transistor stability under energy input is achieved by the inhibition/arrest of the transport of oxygen within the transistor. This is even true in the use of very strongly oxygen affine materials. Even manufacturing stages under increased temperatures can thus be used with reduced parasitic effects.

One or more of the barrier layers are preferably formed from a subtractively structured conductive layer in direct contact with the oxidic semiconductor channel. This layer can be the only barrier layer, or can be combined with other barrier layers.

The layer in direct contact with the channel's oxide semiconductor, which acts as a kind of second contact material, serves on one hand as a bridge between contact material and oxide semiconductor and, on the other hand, as material to be etched in the back channel etch process. Operation as the bridge avoids high series resistances or idle running which would, for example, specifically arise through the provision of a barrier layer.

The drain and source contacts also can be made from the same material as the layer in direct contact with the oxidic semiconductor channel.

The layer in direct contact with the oxidic semiconductor channel preferably consists of an oxidic, doped and/or undoped semiconductor. This layer is electrically conductive, or semiconductive, but is at the same time an oxidative insulating bridge between the contact material and the semiconductor channel. Since oxide semiconductors have the property of insulating very well in the off state, where reverse currents are not uncommon in the femtoampere range, the very high electrical resistance is lowered by doping the oxidic semiconductor, so that the lead resistance to a channel with relatively short distances to be bridged remains significantly below thin-film transistor contact resistances. In order to achieve as good as possible an adaptation of this degenerated oxide semiconductor to the channel material, it is advantageous to use the same intrinsic oxidic semiconductor material as that which occurs at least as a component in the channel material.

Zinc oxide, especially aluminium zinc oxide, lends itself as a channel oxide semiconductor made from a zinc oxide compound for the layer in direct contact with the oxidic semiconductor channel. Aluminium zinc oxide (AZO) can be etched onto the suitable channel oxide semiconductor material indium gallium zinc oxide (IGZO) in a back channel etching process by wet chemical processes with selectivity greater than 8:1. At the same time, this AZO etching offers very good electrical adaptation, so that later heating stages in the transistor's manufacture can be carried out at lower temperatures.

One or more of the barrier layers also consist of an electrical insulator, especially silicon oxide or silicon nitride. This choice of material for the barriers permits these to perform an additional function as an etch stopper during the thin-film transistor's manufacturing process. The etch stopper allows the use of highly diverse contact materials which could be structured using equally varying processes. Molybdenum oxide nitride, aluminium oxide, chrome oxide or a polymer are other possible materials for the barrier layer.

In an embodiment, the invention provides a process for the manufacture of a transistor in which one or more of the barrier layers is structured by a back channel etch process. The back channel etch process preferably is carried out by a wet chemical process.

In a further variation of the process the one or more barrier layers are manufactured by deliberate oxidation of the contact material. In order to inhibit the oxygen exchange between the contacts and the semiconductor channel, oxidic boundary layers in any case being formed are deliberately used parasitically as barriers during production. The barriers are inserted during the separation of the individual transistor layers, or deliberately produced in a follow-up stage by pre-ageing of the contacts above the threshold temperature in an oxygen atmosphere. Same are implemented without essentially changing the properties of the oxide semiconductor channel. Chrome oxide is especially suitable as an oxygen barrier, whilst contact resistance nonetheless remains small by reason of the large-area contacts.

Other advantages arise if at least one barrier layer, consisting of a conducting oxidic semiconductor material, is applied to the oxidic semiconductor channel and structured in such a way that this layer forms a bridge between the semiconductor channel and the contacts. This bridge can extend in a vertical direction.

It is, however, also conceivable to structure the barrier layer from the material in direct contact with the oxide semiconductor in such a way that the contact material is cut short a certain distance before the semiconductor channel. The barrier layer occupies this break, forming a lateral bridge to that channel.

The process is carried out with at least three photolithographic structurings of the transistor layers. The manufacture of a thin-film transistor by three such stages is possible according to the invention. If a further photolithographic stage is carried out, the semiconductor channel can be pre-structured in addition.

With four masks and photolithographic structuring, a complete monochrome AMLCD or AMOLED display with black matrix also can be manufactured by applying thin-film transistors, according to the invention. The structuring includes a gate mask, a mask for the barriers, a mask for the contacts and a fourth mask for the pixel electrode or black matrix, which can simultaneously serve as passivation for the thin-film transistors.

In one design form, a gate material is firstly applied to a substrate and photolithographically structured, before a successive layer sequence consisting at least of a gate dielectric, an oxidic semiconductor for the channel and at least one barrier layer is applied, which structures at least one barrier layer photolithographically.

A contact material is then applied and photolithographically structured. If one of the barrier layers is an oxidic semiconductor which is in direct contact with the semiconductor channel, this layer is structured with the structured contact material as a mask in a back channel etch process. Alternatively, the oxidic semiconductor material also can be used to form the contacts.

In a variation of this process, the oxidic semiconductor material is pre-structured by applying a further photolithographic mask to the channel before at least one barrier layer and the contact material are applied and structured.

BRIEF DESCRIPTION OF THE DRAWINGS

Further features and advantages of the invention will become apparent from the description of embodiments that follows, with reference to the attached figures, wherein.

DETAILED DESCRIPTION OF THE PREFERRED EMBODIMENTS

Figure 1A:
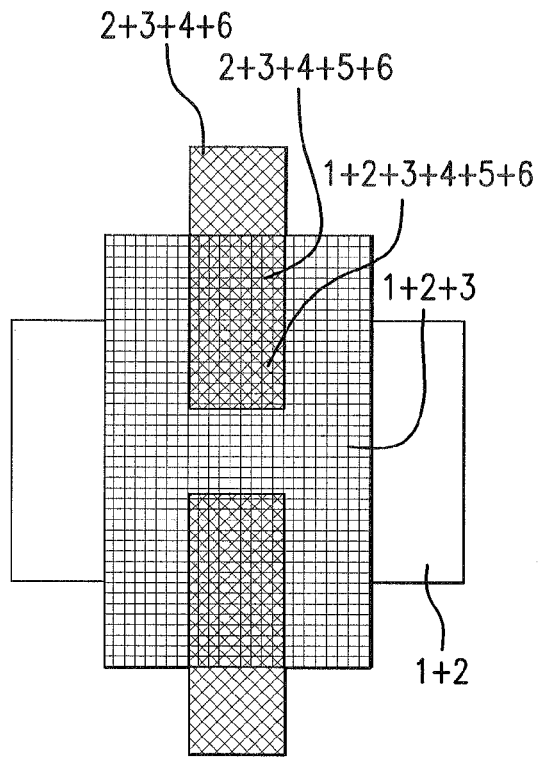
FIG. 1A depicts a top view of a first transistor fabricated according to the inventive principles.
Figure 1C:
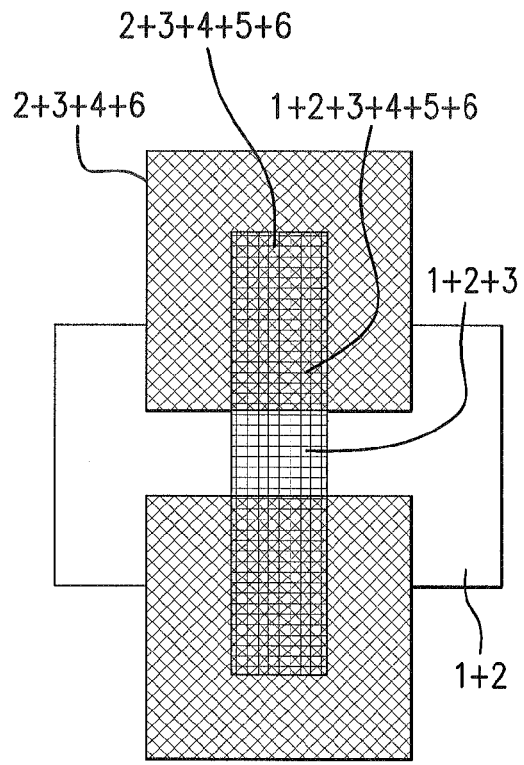
FIG. 1C depicts a top view of a second transistor fabricated according to the inventive principles.

The following is a detailed description of example embodiments of the invention depicted in the accompanying drawings. The example embodiments are presented in such detail as to clearly communicate the invention and are designed to make such embodiments obvious to a person of ordinary skill in the art. However, the amount of detail offered is not intended to limit the anticipated variations of embodiments; on the contrary, the intention is to cover all modifications, equivalents, and alternatives falling within the spirit and scope of the present invention, as defined by the appended claims.

In the diagrams of the transistors of FIGS. 1-5, layers consisting of the same material are in each case shown with the same reference sign. All structures are applied to a substrate not shown in detail.

The transistors depicted in FIGS. 1A, 1B, 1C and 1D are manufactured in three lithographic stages. In the first stage, a substrate is coated with a gate material 1 and photolithographically structured. In a second stage, a gate dielectric 2 is applied and covered entirely by an oxide semiconductor 3. Thereafter, a layer 4 is provided in direct contact with the oxide semiconductor 3 and a barrier layer 5 provided on a portion thereon, as shown.

The barrier layer 5, which is at the same time the uppermost of the consecutively separated layers, is subsequently photolithographically structured. After a final layer of contact material 6 is applied and separated for the manufacture of the thin-film transistor contacts or feeds, the third lithographic stage for the structuring of the contacts from this layer 6 follows. The structures thus arising, together with the structured barrier 5, serve as a mask for the etching of the material of layer 4 in direct contact with the oxide semiconductor 3, and of the oxide semiconductor 3 itself, onto the contacts or feeds to the thin-film transistor.

The barrier layer 5 above the oxide semiconductor 3 is then further selectively etched to the underlying material of layer 4 in direct contact with the oxide semiconductor, while remaining in existence beneath the contact material 6 and thus providing the barrier effect. The layer 4 in direct contact with the oxide semiconductor, which was protected in the etching of the contacts 6 by the barrier 5, is then exposed and subtractively removed via a back channel etch process.

The material of layer 4 may be a conducting or semiconducting material, where the material of barrier layer 5 may be silicon oxide or silicon nitride. In special cases, layer 4 can be formed from an insulating material in order to function as a barrier layer, but to do so the layer 4 must be relatively very thick. The actual thickness, which is between 1 and 10 nanometers, preferably 3-5 nanometers, and most preferably 4 nanometers, is dependent on the particular material used for layer 4. In that case, i.e., where layer 4 is relatively very thick and made of insulating material, no barrier layer 5 is required, as depicted in FIG. 1E.

As a final step, the oxide semiconductor 3 is directly protected from the contact material 6 by the barrier 5, or is removed to a certain effective distance from that contact material 6, and electrically bypassed by the material of layer 4 in direct contact with the oxide semiconductor so that, depending on the contact material 6 used, a better adjustment to the oxide semiconductor material 3 is induced. As a result, the thin-film transistor exhibits greater stability under stress such as, for example, current flow, high temperatures and similar. By an appropriate choice of the barrier layer 5, this structure is suitable for combining all kinds of contact materials 6 with very varying etching processes.

Figure 1B:
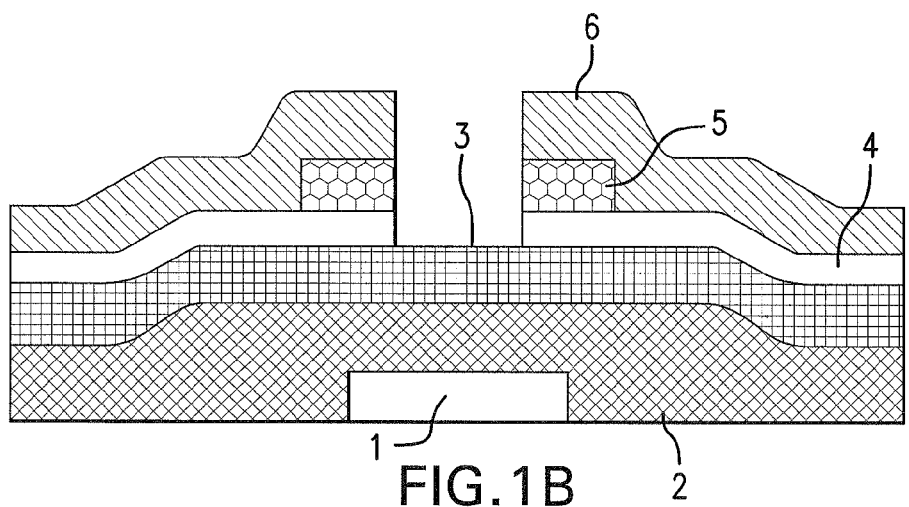
FIG. 1B depicts a cross section view of the transistor of FIG. 1A.
Figure 1D:
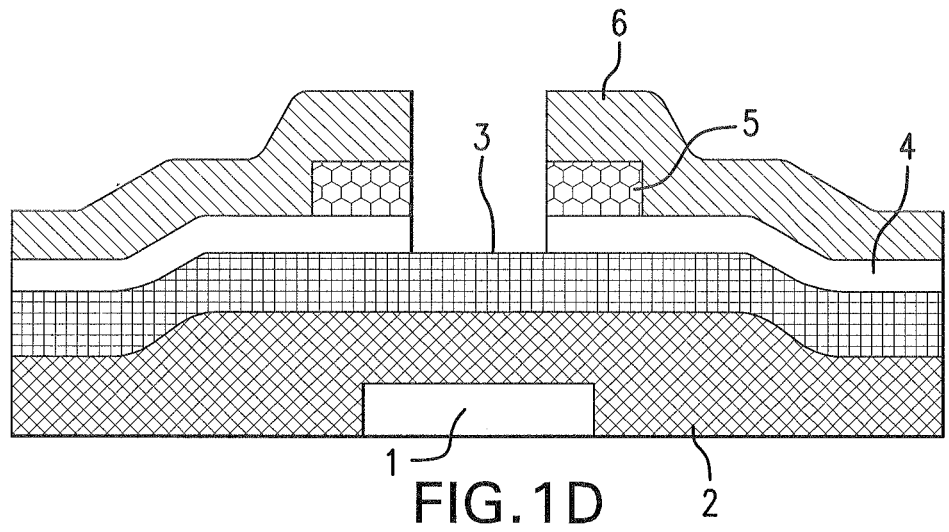
FIG. 1D depicts a cross section view of the transistor of FIG. 1C.
Figure 1E:
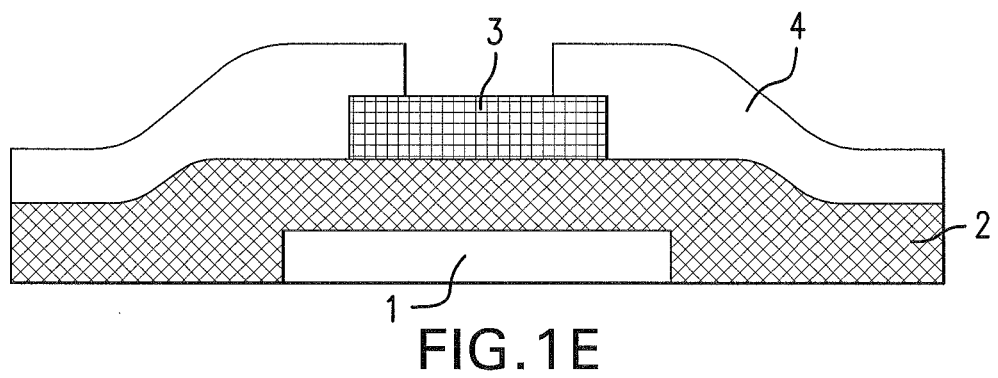
FIG. 1E depicts a cross section view of a transistor wherein the barrier layer is formed from a subtractively structured conductive layer in direct contact with the oxidic semiconductor channel.

The structure in FIG. 1B is preferred in carrying out the process in which the oxide semiconductor 3 is laterally wider designed than the contact material 6. It is thus ensured that, unlike in FIG. 1C, sub-areas arise in the structure, such as for example, at the four corners of the active oxide semiconductor area 1+2+3 at the junction with zone 2+3+4+6, in which the effective distance from the contact material 6 to the oxide semiconductor 3 below cannot be restricted to a minimum amount. However, for both transistor structures in accordance with FIGS. 1A and 10, the same cross sectional configuration arises, corresponding to FIGS. 1B and 1D (as shown).

Figure 2:
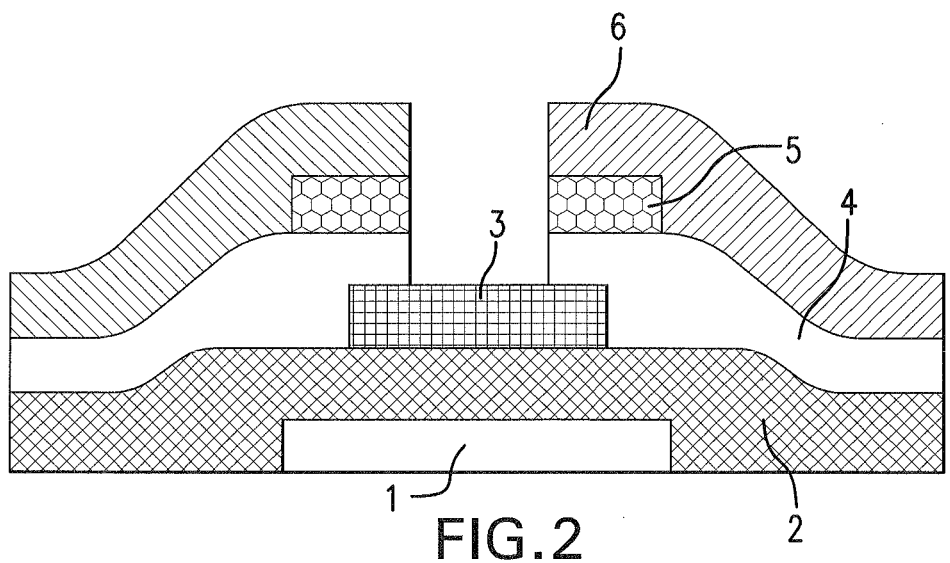
FIG. 2 depicts a cross section view of a third transistor fabricated according to the inventive principles.

A modification of the previously described manufacturing process with a pre-structured semiconductor island, which is made with an additional mask, can be seen in FIG. 2. This transistor's manufacturing process can be better controlled with regard to the occurrence of sub-etchings of the various layer materials by the, now only double layered, feeds at the edge of the transistor, even in the use of wet chemical etching processes for the etching of this double layer.

Figure 3A:
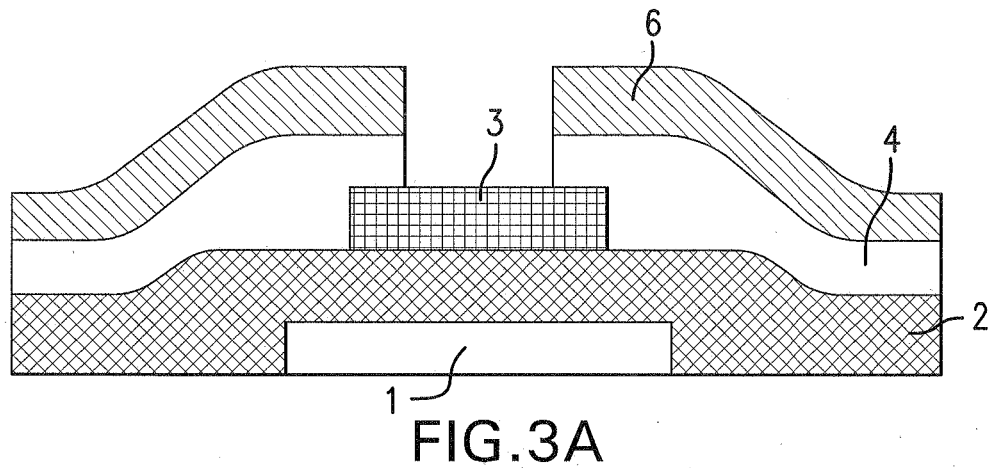
FIG. 3A depicts a cross section of a fourth transistor fabricated according to the inventive principles.
Figure 3B:
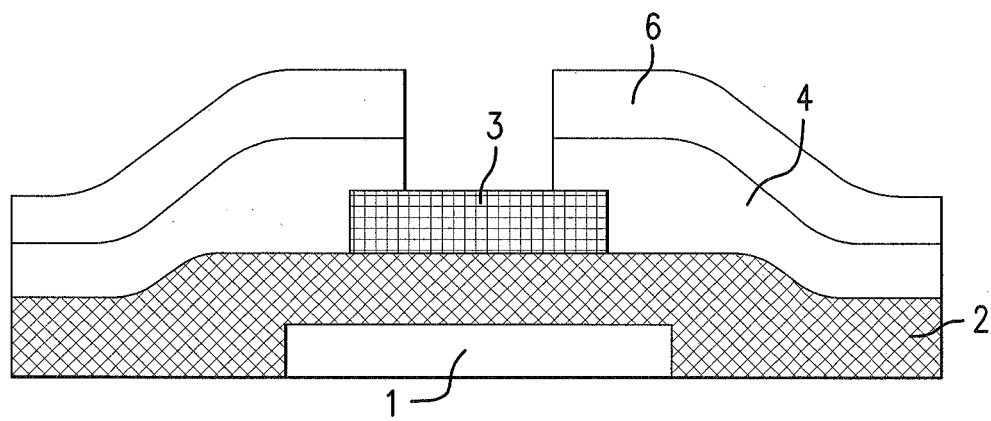
FIG. 3B depicts drain and source contacts formed, of the same material of which the subtractively structured conductive layer is formed.
Figure 3C:
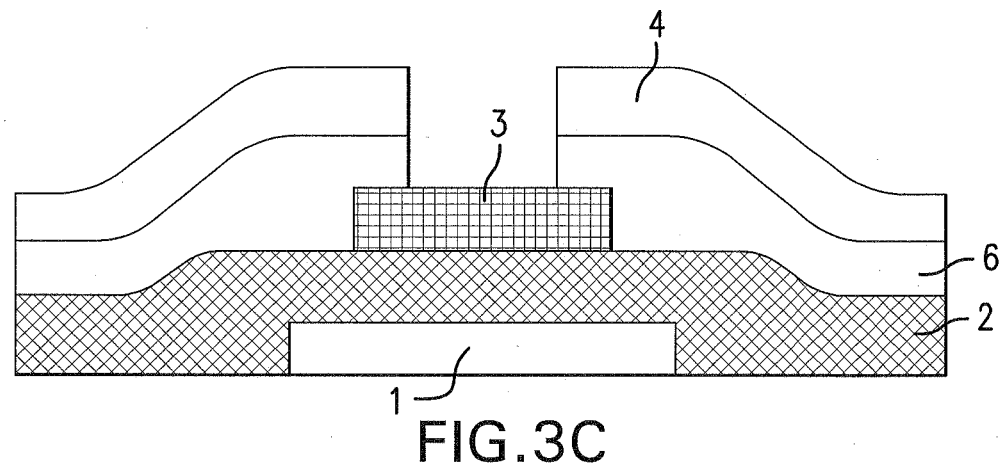
FIG. 3C depicts a variation of the FIG. 3B transistor construction.
Figure 4A:
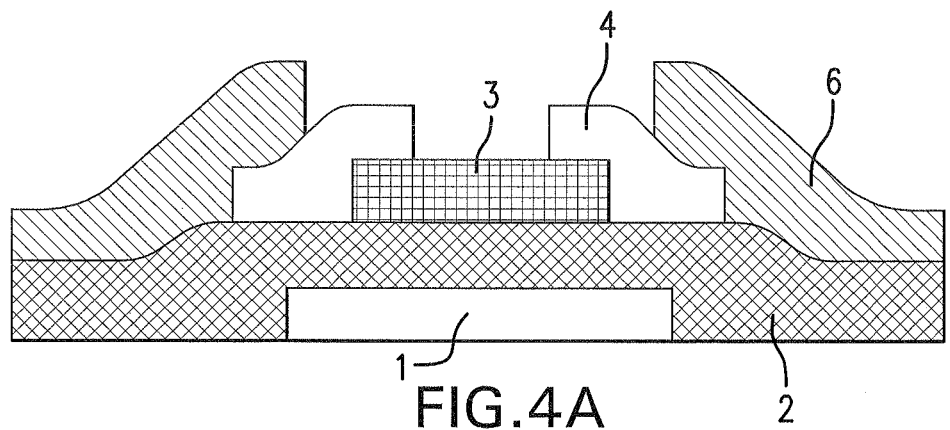
FIG. 4A depicts a cross section a fifth transistor fabricated according to the inventive principles.
Figure 4B:
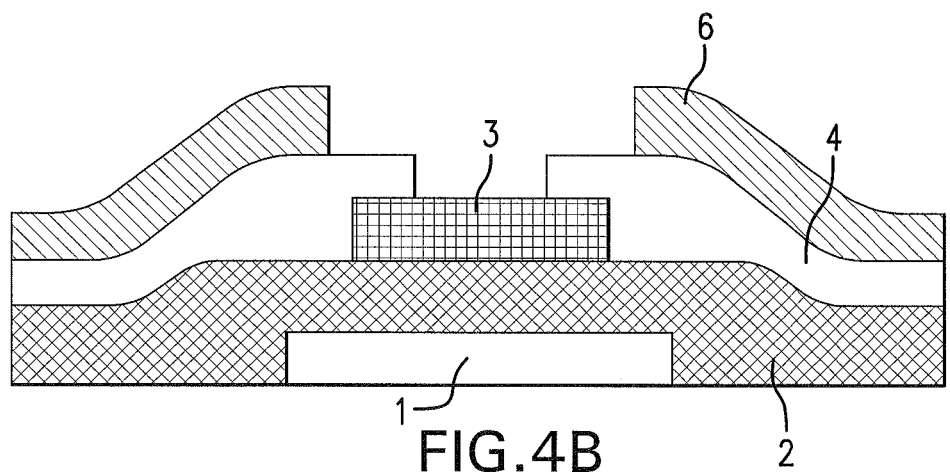
FIG. 4B depicts a cross section a sixth transistor fabricated according to the inventive principles.
Figure 4C:
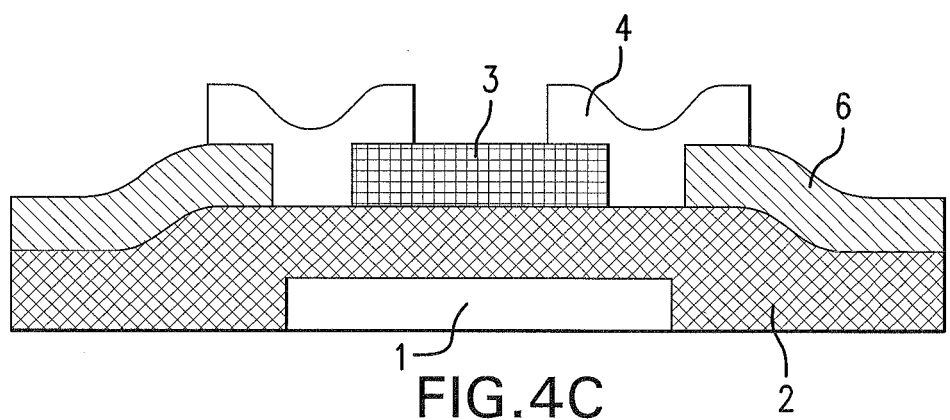
FIG. 4C depicts a cross section a seventh transistor fabricated according to the inventive principles.
Figure 4D:
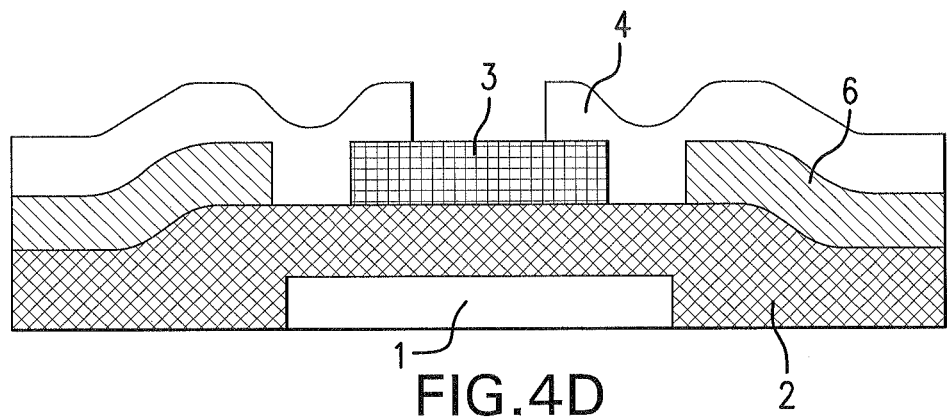
FIG. 4D depicts a cross section an eighth transistor fabricated according to the inventive principles.

FIG. 3A shows a further variation of the thin-film transistor in which the material of layer 4 in direct contact with the oxide semiconductor 3 serves as a barrier. FIG. 3B depicts drain and source contacts 6 formed from a material of which the subtractively structured conductive layer 4 is formed. FIG. 3C shows a functional equivalent of the FIG. 3B transistor construction, wherein the subtractively structured conductive layer 4 is formed atop the drain and source contacts of the same material. This structure does, however, have the disadvantage that the barrier 5 must here be very thickly designed and the back channel etch process can be less well controlled.

Further alternatives, consisting of transistors manufactured with four lithography masks, and with the material of layer 4 in direct contact with the oxide semiconductor 3 acting as a barrier between the oxidic semiconductor channel 3 and the contacts 6 in a lateral direction, can be seen in FIGS. 4A-4D.

Figure 5:
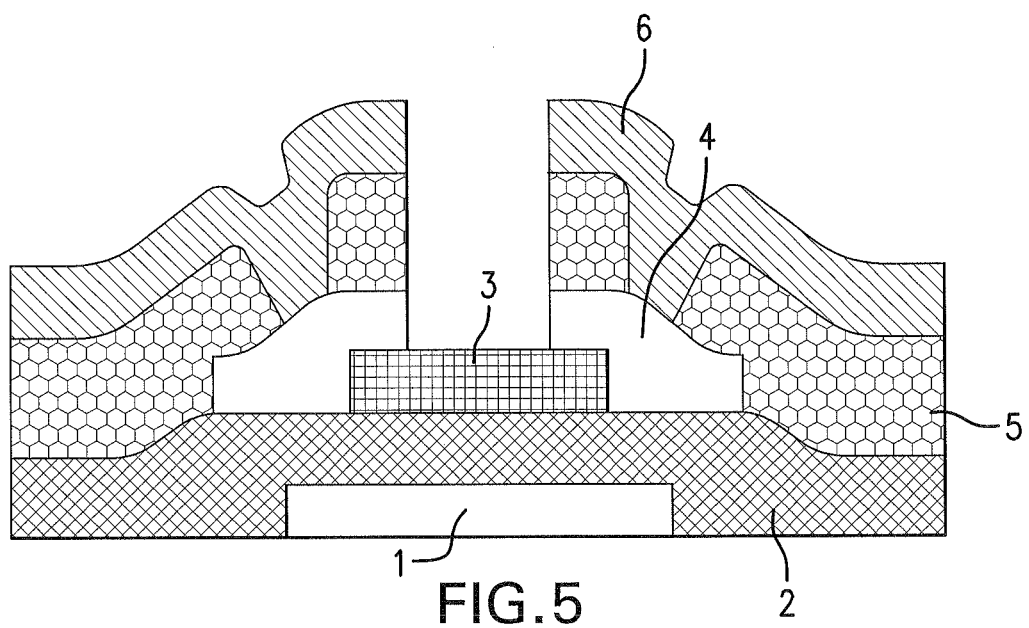
FIG. 5 depicts a cross section a ninth transistor fabricated according to the inventive principles.

A process for the manufacture of a thin-film transistor in accordance with FIG. 5, in which five lithography masks are used, is likewise conceivable. Here the material of layer 4 in direct contact with the oxide semiconductor 3 is structured with the aid of the back channel etch process following the structuring of the oxide semiconductor 3. Holes are made in the barrier layer 5 via which the contact material 6 is combined with the material 4 in direct contact with the oxide semiconductor 3. Contact resistances between the contact material 6 and the material of layer 4 in direct contact with the oxide semiconductor 3 are thus essentially determined by the relatively small overlapping surfaces (hole sizes).

As will be evident to persons skilled in the art, the foregoing detailed description and figures are presented as examples of the invention, and that variations are contemplated that do not depart from the fair scope of the teachings and descriptions set forth in this disclosure. The foregoing is not intended to limit what has been invented, except to the extent that the following claims so limit that.

What is claimed is:

1. A thin-film transistor, comprising:
    an oxidic semiconductor channel;
    metallic or oxidic gate, drain and source contacts; and
    multiple barrier layers positioned between the oxidic semiconductor channel and the drain and source contacts to inhibit an exchange of oxygen between the oxidic semiconductor channel and the drain and source contacts;

wherein one of the barrier layers is formed from a subtractively structured conductive layer in direct contact with the oxidic semiconductor channel; and wherein another of the barrier layers is formed of an electrical insulator comprising silicon oxide or silicon nitride.

2. The thin-film transistor in accordance with claim 1, wherein the drain and source contacts are formed from a material of which the subtractively structured conductive layer is formed.

3. The thin-film transistor in accordance with claim 1, wherein the subtractively structured conductive layer comprises of an oxidic, doped semiconductor, an oxidic un-doped semiconductor or an oxidic, doped and undoped semiconductor.

4. The thin-film transistor in accordance with claim 3, wherein the subtractively structured conductive layer at least partially comprises a zinc oxide compound.

5. The thin-film transistor in accordance with claim 4, wherein the zinc oxide compound is an aluminium zinc oxide compound.

6. The thin-film transistor in accordance with claim 1, wherein the oxidic semiconductor channel comprises a zinc oxide compound.

7. The thin-film transistor in accordance with claim 6, wherein the zinc oxide compound is an indium gallium zinc oxide compound.

8. An active matrix display formed with thin-film transistors, the thin-film transistors comprising:

an oxidic semiconductor channel;

metallic or oxidic gate, drain and source contacts; and multiple barrier layers positioned between the oxidic semiconductor channel and the drain and source contacts to inhibit an exchange of oxygen between the oxidic semiconductor channel and the drain and source contacts;

wherein one of the barrier layers is formed from a subtractively structured conductive layer in direct contact with the oxidic semiconductor channel and operates as an electrical bridge between the oxidic semiconductor channel and the drain and source contacts; and wherein another of the barrier layers is formed of an electrical insulator comprising silicon oxide or silicon nitride.

* * * * *